United States Patent [19]
Sasaki

[11] Patent Number: 6,073,267
[45] Date of Patent: Jun. 6, 2000

[54] SEMICONDUCTOR INTEGRATED CIRCUIT WITH ERROR DETECTING CIRCUIT

[75] Inventor: Makoto Sasaki, Kanagawa, Japan

[73] Assignee: NEC Corporation, Tokyo, Japan

[21] Appl. No.: 08/937,657

[22] Filed: Sep. 24, 1997

[30] Foreign Application Priority Data

Sep. 25, 1996 [JP] Japan .................................... 8-252731

[51] Int. Cl.[7] .................................................. G06F 11/00
[52] U.S. Cl. ........................... 714/799; 714/718; 714/758
[58] Field of Search ..................................... 714/718, 719, 714/763, 768, 726, 729, 737, 744, 730, 725, 800, 805, 809, 799; 365/201

[56] References Cited

U.S. PATENT DOCUMENTS

| | | | |
|---|---|---|---|
| 3,585,378 | 6/1971 | Bouricius | 235/153 |
| 4,167,780 | 9/1979 | Hayashi | 364/200 |
| 5,226,043 | 7/1993 | Pughe, Jr. et al. | 714/772 |
| 5,793,687 | 8/1998 | Deans et al. | 365/201 |

FOREIGN PATENT DOCUMENTS

| | | |
|---|---|---|
| 26 55 653 | 6/1978 | Germany . |
| 2655653 | 6/1978 | Germany . |
| 53-78127 | 7/1978 | Japan . |
| 63-18597 | 1/1988 | Japan . |
| 1-292550 | 11/1989 | Japan . |
| 2-302833 | 12/1990 | Japan . |

OTHER PUBLICATIONS

Patent Abstract of Japan, 58107966, Jun. 1983.

Primary Examiner—Trinh L. Tu
Assistant Examiner—Jason Greene
Attorney, Agent, or Firm—Foley & Lardner

[57] ABSTRACT

An instruction code is stored to an instruction ROM in advance and the instruction ROM outputs an instruction code signal corresponding to an address signal. A program counter sequentially outputs and stores the address signal in synchronization with a clock signal. An instruction register temporarily stores and outputs the instruction code signal in synchronization with the clock signal. A check code generating circuit generates a check code signal every cycle of the clock signal in accordance with a signal outputted of the instruction register and the address signal. Thereafter, a comparator detects an error in operation of the instruction ROM by comparing the check code signal and a check data signal corresponding to the instruction code and its address value.

9 Claims, 6 Drawing Sheets

SEMICONDUCTOR INTEGRATED CIRCUIT WITH ERROR DETECTING CIRCUIT

BACKGROUND OF THE INVENTION

1. Field of the Invention

The present invention relates to a semiconductor integrated circuit operated by an instruction program stored to a built-in memory, and particularly relates to a semiconductor integrated circuit with an error detecting circuit capable of accurately detecting an operating error of an instruction memory.

2. Description of the Prior Art

FIG. 1 is a block diagram showing the construction of a conventional semiconductor integrated circuit. As shown in FIG. 1, the conventional integrated circuit has a program counter 1, an instruction ROM 2, an instruction register 5 and a decoder 8. A clock signal 101 and an instruction address signal 103 are inputted to the program counter 1. The program counter (first memory) 1 sets an address by an input of the instruction address signal 103. The program counter 1 is a circuit for sequentially outputting an address signal 104 to the instruction ROM 2 in synchronization with the clock signal 101 and storing the address signal 104. The program counter 1 is constructed by a register. An instruction code of a program is stored to the instruction ROM 2 in advance. The instruction ROM 2 is an instruction memory for outputting an instruction code signal 105 to the instruction register 5 in accordance with the address signal 104 and is constructed by a ROM (read only memory).

The clock signal 101 and the instruction code signal 105 are inputted to the instruction register 5. The instruction register (second memory) 5 is a circuit for temporarily storing the instruction code signal 105 in synchronization with the clock signal 101 and outputting an instruction data signal 113 to the decoder 8. The instruction register 5 is constructed by a register. The decoder 8 decodes the inputted instruction data signal 113 and outputs a unit control signal 117 for controlling the operation of an instruction executing unit of the semiconductor integrated circuit. For example, such a semiconductor integrated circuit is widely used in a microcomputer, etc.

An operation of the conventional semiconductor integrated circuit constructed above will next be explained. First, an instruction address signal 103 is inputted to the program counter 1. Thus, the program counter 1 sets an address and sequentially outputs an address signal 104 in synchronization with a clock signal 101. Next, when the address signal 104 is inputted to the instruction ROM 2, an instruction code stored to the instruction ROM 2 is read by designating an address signal. The instruction ROM 2 then outputs the instruction code to the instruction register 5 as an instruction code signal 105.

The instruction register 5 temporarily stores the instruction code signal 105 in synchronization with the clock signal 101. An instruction stored to the instruction register 5 is outputted from the instruction register 5 as an instruction data signal 113 and is then inputted to the decoder 8. The decoder 8 decodes the inputted instruction data signal 113 and generates a unit control signal 117 and outputs the unit control signal 117. The operation of the instruction executing unit of the semiconductor integrated circuit is controlled by the outputted unit control signal 117.

In the conventional semiconductor integrated circuit constructed in this way, when an instruction stored to the instruction ROM 2 has an error, the instruction register 5 stores the instruction having the error and the decoder 8 generates the unit control signal 117 on the basis of this instruction. Then, the operation of the instruction executing unit of the semiconductor integrated circuit is controlled by the unit control signal 117.

However, since the instruction based on the unit control signal 117 has the error, the operation of the instruction executing unit of the semiconductor integrated circuit is different from an expected operation so that an error in operation is caused. When the semiconductor integrated circuit is incorrectly operated by the error in instruction stored to the instruction ROM 2, it is difficult to analyze a cause of this incorrect operation. In particular, an extremely long time is required to analyze this cause since the error in the instruction memory shows various kinds of failure modes.

Therefore, for example, a memory tester having a built-in integrated circuit is disclosed in Japanese Unexamined Publication (KOKAI) No. Sho 63-18597 as a semiconductor integrated circuit capable of detecting an error in memory data. FIG. 2 is a block diagram showing the structure of the memory tester having the built-in integrated circuit. An integrated circuit 21 has a scan path control circuit 31, a memory address register 34, a memory 36 with parity, a parity check circuit 37 and a memory data register 39.

The scan path control circuit 31 is a circuit for outputting a scan path control signal 32 in accordance with a signal inputted from a scan path signal input pin group 30 and controlling the operations of registers (a memory address register 34 and a memory data register 39) constituting a scan path. A scan path input data pin 33 inputs data to the scan path. The memory address register 34 has a reset function for clearing data by a signal inputted from a reset signal input pin 35 and is constructed by a counter and a shift register. A signal on an address data parallel input line 22 is inputted to the memory address register 34 and a signal on an address data parallel output line 24 is outputted from the memory address register 34 and is inputted to the memory 36 with parity.

Data adding a parity bit thereto are stored to the memory 36 with parity. Data outputted from the memory 36 with parity are inputted to the parity check circuit 37 and the memory data register 39. The parity check circuit 37 performs a parity check for detecting an error and makes a correct or incorrect judgment and outputs a count enable signal 38 to the memory address register 34. Then, count-up of the memory address register 34 is inhibited by the count enable signal 38.

Further, a memory data parallel input line 26 and a memory data parallel output line 28 are connected to the memory data register 39. Data outputted from the memory 36 with parity are inputted to the memory data register 39 through the memory data parallel input line 26. The memory data register 39 is a circuit for latching output data from the memory 36 with parity and has a shift register function. A scan data line 40 connects an output of the memory address register 34 at a final stage thereof to an initial stage of the memory data register. Data of the memory data register 39 at a final stage thereof are outputted from a scan path output pin 41.

An operation of the integrated circuit 21 thus constructed will next be explained. First, the memory address register 34 is set to an all "zero" initial state by the reset signal input pin 35. Next, when a predetermined input signal is inputted from the scan path control signal input pin group 30 to the scan path control circuit 31, the scan path control circuit 31 counts up the memory address register 34 by a scan path control signal 32. Output data from the memory 36 with parity are inputted to the parity check circuit 37 every this count-up. Thus, it is judged whether the memory data are correct or incorrect. At this time, the output data from the memory 36 with parity are stored to the memory data register 39. The count-up of the memory address register 34 is continued if the output data are normal as a result of the correct or incorrect judgment in the parity check circuit 37. Thereafter, all address data of the memory 36 with parity are similarly judged.

In contrast to this, when the output data are incorrect as the result of the correct or incorrect judgment in the parity check circuit 37, the parity check circuit 37 inhibits the count-up of the memory address register 34. At this time, an address of data of the memory 36 with parity causing the error is latched to the memory address register 34, and the data of the memory 36 with parity causing the error are latched to the memory data register 39. Accordingly, the memory address register 34 and the memory data register 39 constitutes a scan path construction by inputting a predetermined signal from the scan path control signal input pin group 30 to the scan path control circuit 31. Thereafter, the address and the data stored to the memory address register 34 and the memory data register 39 are outputted from the scan path output pin 41 so that error information can be observed.

In the integrated circuit 21, arbitrary data of the memory 36 with parity can be observed by using the scan path constructed by the memory address register 34 and the memory data register 39. Namely, an arbitrary address is set to the memory address register 34 by inputting data from the scan path input data pin 33 to the memory address register 34. Thereafter, arbitrary data in the memory 36 with parity are outputted from the scan path output pin 41. By this, the arbitrary data of the memory 36 with parity can be observed.

However, in the above conventional integrated circuit 21, memory data are sequentially read by an address regularly changed so that error depending on an irregular change in address at an application operating time of a user can not be detected.

The error depending on the change in address will be described. Namely, when a memory area is divided into three banks or more and data of another bank are read by jumping one bank or more, the delay of an address decode caused by a change in address from one address to another address is increased when data are read from one bank and data are then read from another bank. Thus, data can not be read within a predetermined operating frequency so that an error is caused.

In the conventional integrated circuit, no address information is checked when an error in memory output data is detected. Accordingly, when contents at an address except for a designated address are read and incorrect data are read by a failure on a word line within a memory and so forth, an error check circuit judges the read data as normal data. As a result, error can not be accurately detected.

Since an error in data themselves read from the memory is detected in the conventional integrated circuit, a delay time from the memory to a register for storing these data is longer than a delay time from the memory to the error check circuit. Accordingly, when a register can not store data within a predetermined operating frequency, data read from the memory can not be stored and an error in operation is caused even if these data are judged as normal data. Accordingly, error can not be accurately detected.

As a result, address causing the error in operation can not be specified at an error generating time. Also, when one word of the memory is constructed by plural bits, bit position of the read data causing the error can not be specified. Accordingly, it is impossible to judge whether the error is caused since each circuit does not normally function, or the error is caused by a defect in manufacture. Thus, an extremely long time is required to analyze the error.

Further, since no application program is operated at an error detecting time, it is impossible to confirm whether an application program subsequent to a cycle having the detected error is normally operated. As a result, no countermeasures of the error can be taken and no normal operation can be confirmed so that reliability of a user is lost.

SUMMARY OF THE INVENTION

An object of the present invention is to provide a semiconductor integrated circuit with an error detecting circuit capable of accurately detecting an error in operation of an instruction memory so that analysis and countermeasures with respect to a defect can be rapidly executed.

A semiconductor integrated circuit according to the present invention has an instruction memory, a first memory, a second memory and an error detecting circuit. An instruction code is stored to the instruction memory in advance and an address signal is inputted to the instruction memory. The instruction memory outputs an instruction code signal corresponding to the address signal. A clock signal is inputted to the first memory. The first memory sequentially outputs and stores the address signal in synchronization with the clock signal. The second memory temporarily stores and outputs the instruction code signal in synchronization with the clock signal. The error detecting circuit detects an error in operation of the instruction memory by comparing a check code signal generated every cycle of the clock signal with check data corresponding to the instruction code and its address value in accordance with a signal outputted from the second memory and the address signal.

The error detecting circuit can have a third memory, a check code generating circuit, a check data memory, a fourth memory and a comparator. At this time, the third memory temporarily stores and outputs the address signal in synchronization with the clock signal. The check code generating circuit generates the check code signal in accordance with signals outputted from the second and third memory. The instruction code and the check data corresponding to its address value are stored to the check data memory in advance. The check data memory outputs a check data signal corresponding to the address signal. The fourth memory temporarily stores and outputs the check data signal outputted from the check data memory in synchronization with the clock signal. The comparator compares a signal outputted from the fourth memory with the check code signal outputted from the check code generating circuit and outputs a compared result signal.

The error detecting circuit may have a scan mode switching control circuit and a buffer. At this time, the scan mode switching control circuit controls switching to a scan mode operation in accordance with a scan mode signal and the compared result signal. The buffer outputs each scan signal in series at a time of the scan mode operation in accordance with a signal outputted from this scan mode switching control circuit. In this case, the first to fourth memory perform the scan mode operation corresponding to the signal outputted from the scan mode switching control circuit. The scan signal is sequentially inputted to the first to fourth memory and is sequentially outputted from the memory to the buffer.

The scan mode switching control circuit can control the switching to the scan mode when compared results of the comparator are not in conformity with each other.

The buffer may have a scan-out terminal and the scan signal can be outputted in series from the buffer through this scan-out terminal. Further, the first memory may have a scan-in terminal and an expected value signal can be inputted to the first memory through this scan-in terminal.

Furthermore, the instruction memory can be constructed by a read only memory. Further, the check data memory can be constructed by a read only memory. Furthermore, the check code signal can be set to a signal of one kind selected from a group of a check sum signal and a parity signal.

The semiconductor integrated circuit in the present invention has an error detecting circuit for generating an instruction code signal read from the instruction memory and a check code signal corresponding to a read address signal of this instruction code signal every cycle. The error detecting circuit compares the check code signal with a check data signal corresponding to an instruction code and its address value. Accordingly, it is possible to detect an error depending on an irregular change in address at an application operating time of a user.

The check code signal is calculated from the instruction code signal read from the instruction memory and its read address signal. Accordingly, an error in address can be accurately detected even when contents at an address different from a designated address are read from the memory by a failure on a word line and so forth within the memory.

The second memory temporarily stores the instruction code signal read from the instruction memory and its read address signal. The fourth memory temporarily stores the check data signal read from a check data memory storing check data thereto. Thereafter, when an error in data is detected, the error in data can be accurately detected even when an address is changed within a predetermined operating frequency and data read from the instruction memory are not correctly stored.

When the error is detected and the instruction code signal read from the instruction memory and its read address signal are observed, a storing address of data causing the error can be specified. When one word of the instruction memory is constructed by plural bits, the position of a bit causing the error can be specified. Accordingly, it is possible to judge whether the error is caused since each circuit does not normally function, or the error is caused by a defect in manufacture. Thus, a time required to analyze the error can be shortened so that countermeasures of the error can be rapidly executed.

When an expected value signal is inputted to the first memory, an expected value of the instruction having the detected error is inputted to the fourth memory. An instruction for correcting an error portion to an expected value is inputted to the second memory. An address for storing the instruction having the detected error is inputted to the third memory. An instruction for reading the next cycle to a cycle having the detected error and an address for designating an expected value check sum of this instruction are inputted to the first memory. Thus, it is possible to confirm whether the instruction memory is normally operated or not.

When the error is detected and the memory storing data read from the instruction memory and the memory storing a read address of these data are serially connected, contents stored to the memory can be directly observed in a normal operation by a for scanning these stored data so that more accurate information can be obtained.

Furthermore, the number of input terminals (scan-in terminals) and the number of output terminals (scan-out terminals) can be respectively reduced to one in the present invention so that the number of pins limited by a package can be effectively used practically.

DESCRIPTION OF THE PREFERRED EMBODIMENTS

Figure 1:
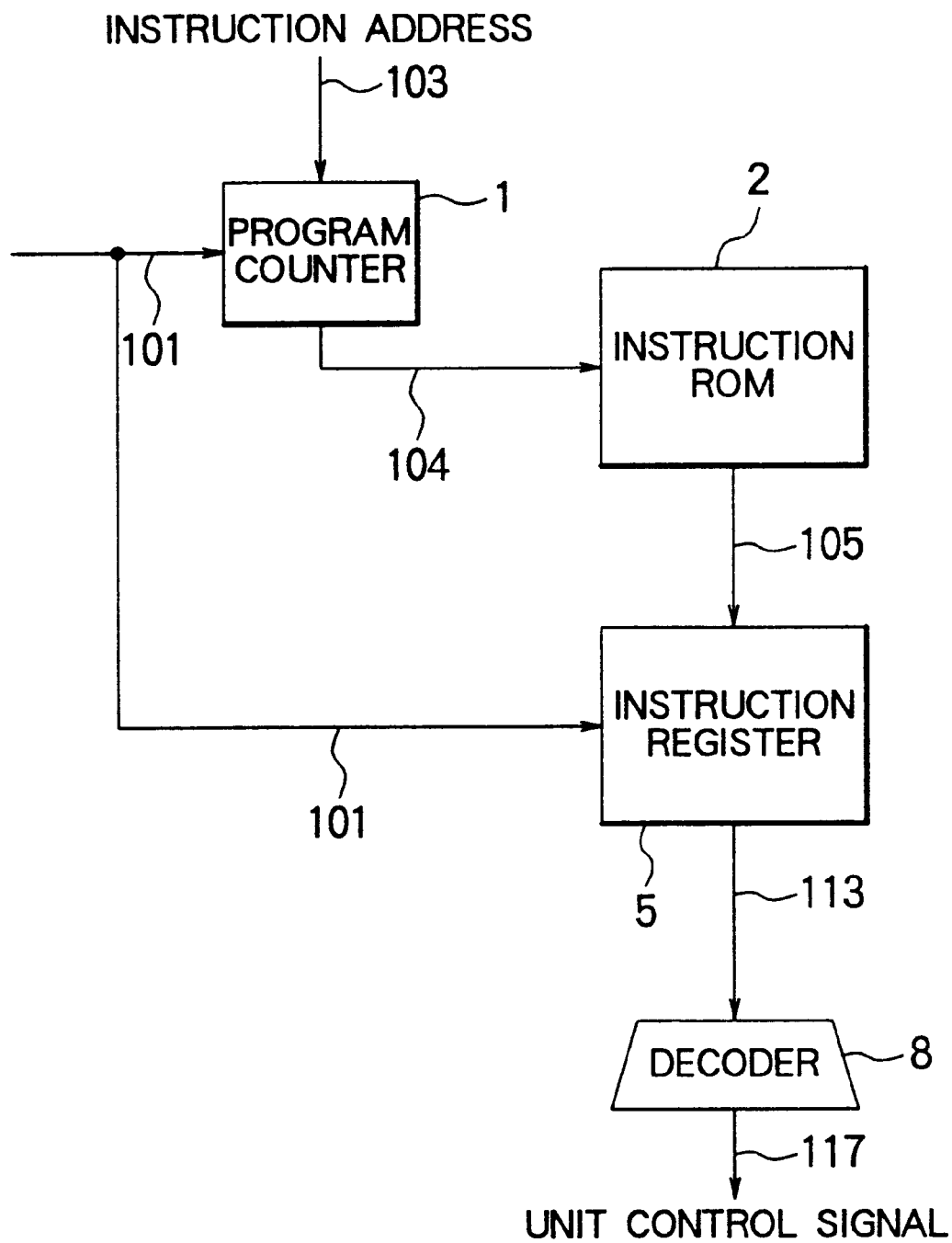
FIG. 1 is a block diagram showing the construction of a conventional semiconductor integrated circuit.
Figure 2:
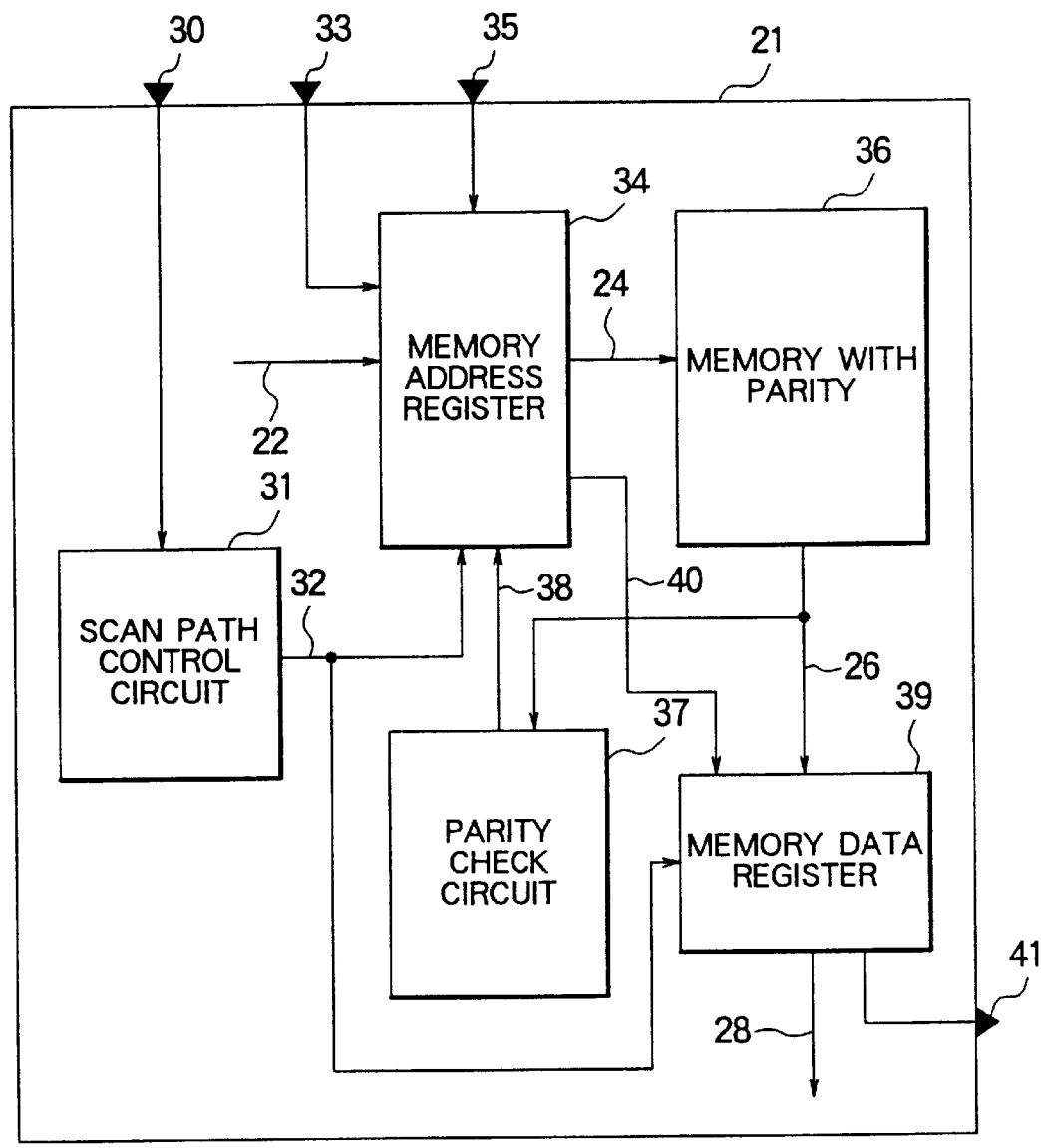
FIG. 2 is a block diagram showing the structure of a memory tester having a built-in integrated circuit.
Figure 3:
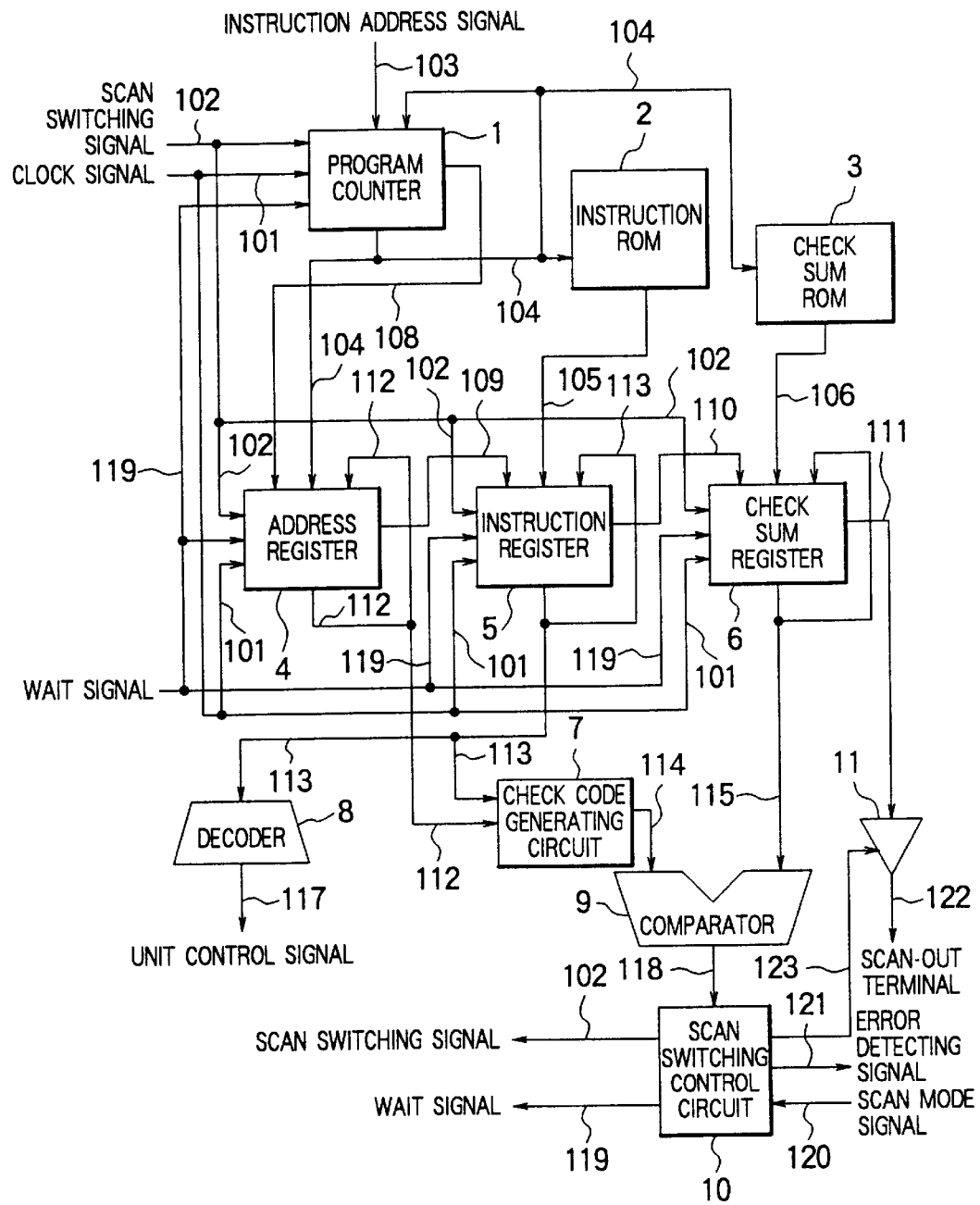
FIG. 3 is a block diagram showing the construction of a semiconductor integrated circuit in accordance with a first embodiment of the present invention.

The embodiments of the present invention will next be concretely described with reference to the accompanying drawings. FIG. 3 is a block diagram showing the construction of a semiconductor integrated circuit in accordance with a first embodiment of the present invention. FIG. 3 particularly shows an error detecting circuit section for detecting an error in operation of an instruction memory. As shown in FIG. 3, similar to the conventional semiconductor integrated circuit shown in FIG. 1, the semiconductor integrated circuit in accordance with the first embodiment has a program counter 1, an instruction ROM 2, an instruction register 5 and a decoder 8. Further, the semiconductor integrated circuit has an address register 4, a check code generating circuit 7, a check sum ROM 3, a check sum register 6, a comparator 9, a scan switching control circuit 10 and a 3-state buffer 11 as an error detecting circuit.

The program counter (first memory) 1 is a circuit for sequentially outputting an address signal 104 to the instruction ROM 2 and the check sum ROM 3 and storing the address signal 104 in synchronization with a rising edge of a clock signal 101. The program counter 1 is constructed by a register of 8 bits. A scan switching signal 102, a wait signal 119, an instruction address signal 103 and an address signal 104 as other input signals are inputted to the program counter 1. A first scan signal 108 as an output signal is outputted from the program counter 1. When the scan switching signal 102 and the wait signal 119 are set to show logic "0", the instruction address signal 103 is selected as an input signal to the program counter 1.

An instruction code is stored to the instruction ROM (instruction memory) 2 in advance. The instruction ROM 2 is a circuit for outputting an instruction code signal 105 in accordance with the address signal 104, and is constructed by 256 words×16 bits. An instruction code of 16 bits is stored to the instruction ROM 2.

The instruction register (second memory) 5 is a circuit for temporarily storing the instruction code signal 105 outputted from the instruction ROM 2 and outputting an instruction data signal 113 in synchronization with the rising edge of the clock signal 101. The instruction register 5 is constructed by a register of 16 bits. The scan switching signal 102, the wait signal 119, a second scan signal 109 and an instruction data signal 113 as other input signals are inputted to the instruction register 5 and a third scan signal 110 as an output signal is outputted from the instruction register 5. When the scan switching signal 102 and the wait signal 119 are set to show logic "0", the instruction code signal 105 is selected as an input signal to the instruction register 5.

The instruction data signal 113 outputted from the instruction register 5 is inputted to the decoder 8. The decoder 8 decodes the instruction data signal 113 and generates a unit control signal 117 for controlling the operation of an instruction executing unit of the semiconductor integrated circuit.

The address register (third memory) 4 is a circuit for temporarily storing the address signal 104 outputted from the program counter 1 and outputting a post address signal 112 in synchronization with the rising edge of the clock signal 101. The address register 4 is constructed by a register of 8 bits. The scan switching signal 102, the wait signal 119 and the first scan signal 108 as other input signals are inputted to the address register 4 and the second scan signal 109 as an output signal is outputted from the address register 4. When the scan switching signal 102 and the wait signal 119 are set to show logic "0", the address signal 104 is selected as an input signal to the address register 4.

The instruction data signal 113 outputted from the instruction register 5 and the post address signal 112 outputted from the address register 4 are inputted to the check code generating circuit 7. The check code generating circuit 7 generates a check code signal (a detected object check sum signal) 114 corresponding to these signals 113 and 112.

An instruction code and an expected value check sum (check data) of 8 bits corresponding to an address value of the instruction code are stored to the check sum ROM (check data memory) 3 in advance. The check sum ROM 3 is a circuit for outputting a check sum code signal (check data signal) 106 corresponding to the address signal 104 and is constructed by 256 words×8 bits.

The check sum register (fourth memory) 6 is a circuit for temporarily storing the check sum code signal 106 outputted from the check sum ROM 3 and outputting a check sum data signal 115 in synchronization with the rising edge of the clock signal 101. The check sum register 6 is constructed by a register of 8 bits. The scan switching signal 102, the wait signal 119 and the third scan signal 110 as other input signals are inputted to the check sum register 6 and a fourth scan signal 111 as an output signal is outputted from the check sum register 6. When the scan switching signal 102 and the wait signal 119 show logic "0", the check sum code signal 106 is selected as an input signal to the check sum register 6.

The comparator 9 compares the check code signal 114 outputted from the check code generating circuit 7 with the check sum data signal 115 outputted from the check sum register 6 and outputs a compared result signal 118.

The compared result signal 118 outputted from the comparator 9 is inputted to the scan switching control circuit 10. The scan switching control circuit 10 performs switching control to a scan mode when no compared results are in conformity with each other. A scan mode signal 120 as another input signal is inputted to the scan switching control circuit 10. The scan switching signal 102, the wait signal 119, an error detecting signal 121 and a buffer control signal 123 as output signals are outputted from the scan switching control circuit 10.

The 3-state buffer 11 is a circuit for outputting serial data constructed by the first, second, third and fourth scan signals 108, 109, 110 and 111 outputted from the program counter 1, the address register 4, the instruction register 5 and the check sum register 6 to a scan-out terminal (output terminal) 122. The buffer control signal 123 as another input signal is inputted to the 3-state buffer 11.

Figure 4:
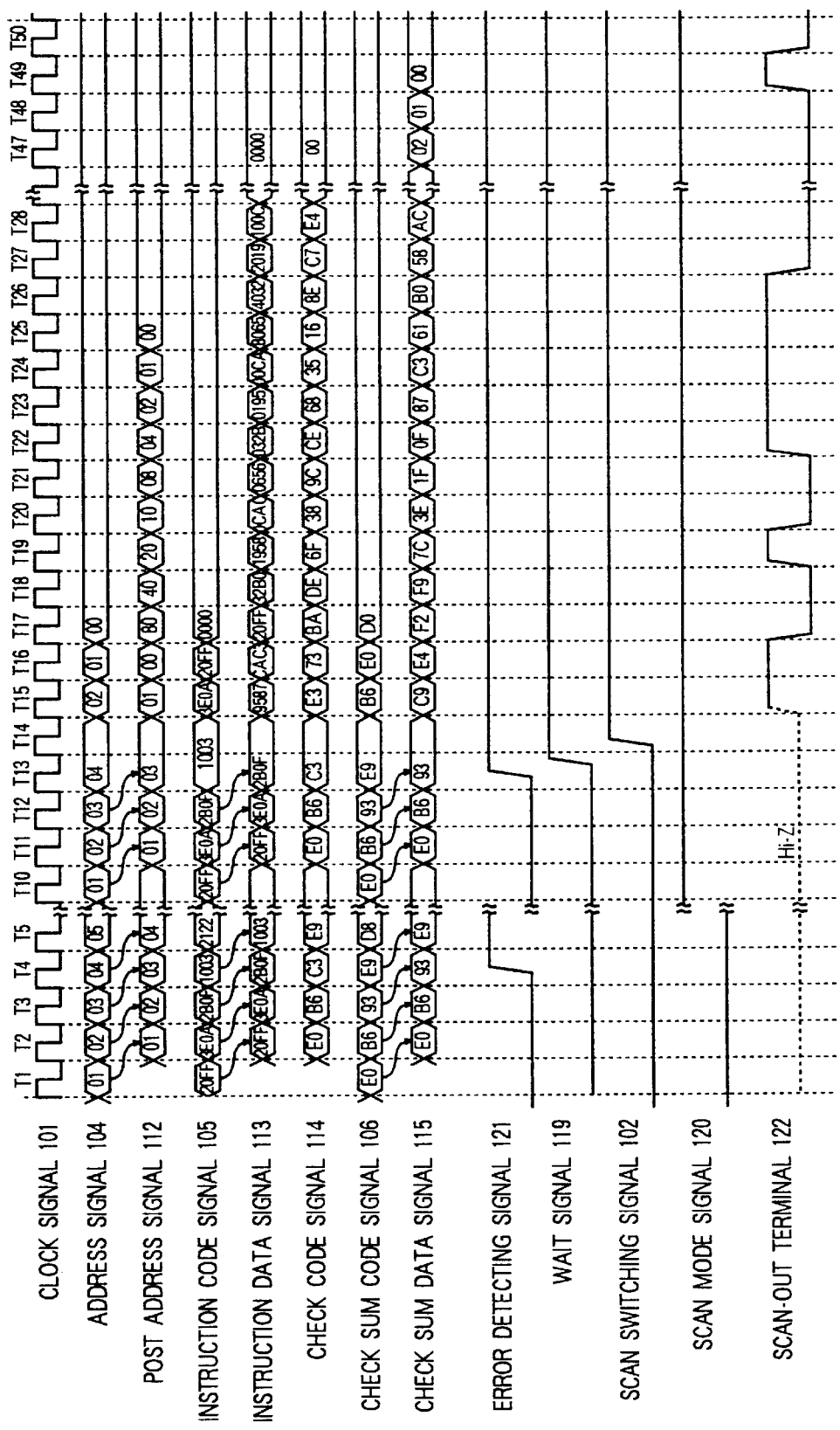
FIG. 4 is a timing chart showing an operation of the semiconductor integrated circuit in accordance with the first embodiment shown in FIG. 3.

FIG. 4 is a timing chart showing an operation of the semiconductor integrated circuit in accordance with the first embodiment shown in FIG. 3. In FIG. 4, signals having bit widths are represented by hexadecimal values. The operation of the semiconductor integrated circuit in accordance with the first embodiment will next be explained with reference to FIGS. 3 and 4. A check sum used in the following explanation is obtained by adding an address for designating a word of a ROM and an instruction stored to the ROM in a byte data unit and taking the complement of 2 of least significant 1 byte data. For example, when the address is a hexadecimal value of [01] and the instruction is a hexadecimal value of [20FF], [01], [20] and [FF] are added to each other in the byte data unit and the complement of 2 of the least significant 1 byte data is then taken. Thus, the check sum becomes a hexadecimal value of [E0].

First, an operation performed from a T1 cycle to a T5 cycle showing a case in which no scan mode operation is executed will be explained as a first operation.

When no scan mode operation is executed, the scan mode signal 120 shows logic "0", and the scan switching signal 102, the wait signal 119 and the buffer control signal 123 show logic "0". The scan-out terminal 122 has high impedance. When the scan switching signal 102 and the wait signal 119 show logic "0", the instruction address signal 103, the address signal 104, the instruction code signal 105 and the check sum code signal 106 are respectively selected as signals inputted to the program counter 1, the address register 4, the instruction register 5 and the check sum register 6.

The instruction ROM 2 outputs a stored instruction at an address of the address signal 104 as the instruction code signal 105. The check sum ROM 3 outputs an expected value check sum as the check sum code signal 106.

In the T1 cycle, the address signal 104 outputted from the program counter 1 shows [01] and the instruction code signal 105 outputted from the instruction ROM 2 shows [20FF]. Accordingly, the check sum code signal 106 outputted from the check sum ROM 3 shows [E0].

In the T2 cycle, the address signal 104 shows [02] and the instruction code signal 105 shows [3E0A]. Accordingly, the check sum code signal 106 shows [B6]. Since the address register 4 stores [01] of the address signal 104 in the T1 cycle, the post address signal 112 in the T2 cycle shows [01]. Since the instruction register 5 stores [20FF] of the instruction code signal 105 in the T1 cycle, the instruction data signal 113 in the T2 cycle shows [20FF]. Further, since the check sum register 6 stores [E0] of the check sum code signal 106 in the T1 cycle, the check sum data signal 115 in the T2 cycle shows [E0].

At this time, when [01] of the post address signal 112 and [20FF] of the instruction data signal 113 are inputted to the check sum generating circuit 7, [E0] of the detected object check sum signal 114 is generated. Thereafter, the comparator 9 compares [E0] of the detected object check sum signal 114 with [E0] of the check sum data signal 115. As a result, the compared signals are in conformity with each other in the T2 cycle so that the compared result signal 118 shows logic "0" and the error detecting signal 121 shows logic "0".

In the T3 cycle, similar to the T2 cycle, [B6] of the detected object check sum signal 114 and [B6] of the check sum data signal 115 are compared with each other in the comparator 9. As a result, the compared signals are also in conformity with each other in the T3 cycle so that the compared result signal 118 shows logic "0" and the error detecting signal 121 shows logic "0".

In the T4 cycle, the address signal 112 shows [04] and the instruction code signal 105 shows [1003] so that the check sum code signal 106 shows [E9]. The post address signal 112 shows [03] and the instruction data signal 113 shows [2B0F]. The check sum data signal 115 shows [93]. At this time, when [03] of the post address signal 112 and [2B0F] of the instruction data signal 113 are inputted to the check sum generating circuit 7, [C3] of the detected object check sum signal 114 is generated. Thereafter, [C3] of the detected object check sum signal 114 and [93] of the check sum data signal 115 are compared with each other in the comparator 9.

[93] of the check sum data signal 115 is a check sum of [03] of the post address signal 112 and [2B3F] of an expected instruction code. Therefore, bits 5 and 4 of [2B0F] of the instruction data signal 113 are different from bits 5 and 4 of [2B3F] of the expected instruction code. Accordingly, the detected object check sum signal 114 and the check sum data signal 115 are not in conformity with each other as a compared result. As a result, the compared result signal 118 shows logic "1" and the error detecting signal 121 shows logic "1" so that an error is transmitted to each unit of the semiconductor integrated circuit.

Next, an operation performed from a T10 cycle to a T54 cycle showing a case in which the scan mode operation is executed will be explained as a second operation.

When the scan mode operation is executed, the scan mode signal 120 shows logic "1", and the scan switching signal 102, the wait signal 119 and the buffer control signal 123 show logic "1" by detecting an error in the above first operation. Therefore, contents stored to each circuit are outputted from the scan-out terminal 122 by the scan operation in a sequential order of the check sum register 6, the instruction register 5, the address register 4 and the program counter 1. This operation will next be described in detail.

An operation from the T10 cycle to the T12 cycle is similar to the operation from the T1 cycle to the T3 cycle in the first operation. Thereafter, [03] of the post address signal 112 and [2B0F] of the instruction data signal 113 are inputted to the check sum generating circuit 7 in the T13 cycle, and [C3] of the detected object check sum signal 114 is generated. Thereafter, [C3] of the detected object check sum signal 114 and [93] of the check sum data signal 115 are compared with each other in the comparator 9. As a result, no compared signals are in conformity with each other. When an error in signal is detected, the compared result signal 118 shows logic "1" and the error detecting signal 121 and the wait signal 119 show logic "1".

When the wait signal 119 shows logic "1", the address signal 104, the post address signal 112, the instruction signal 113 and the check sum data signal 115 are respectively selected as input signals to the program counter 1, the address register 4, the instruction register 5 and the check sum register 6. Then, data stored to each of the registers are again stored in the T14 cycle. An instruction showing the error is stored to the instruction register 5 by this storing operation, and an address storing the instruction showing the error thereto is stored to the address register 4.

In the T14 cycle, when the scan switching signal 102 shows logic "1", the first scan signal 108, the second scan signal 109 and the third scan signal 110 are respectively selected as input signals to the address register 4, the instruction register 5 and the check sum register 6. Thus, the program counter 1, the address register 4, the instruction register 5 and the check sum register 6 attain a serial connecting state so that a shifting operation of bits can be performed.

The shifting operation is started from the T15 cycle. The shifting operation of 1 bit is performed from a high order bit side to a low order bit side in the program counter 1, the address register 4, the instruction register 5 and the check sum register 6. Namely, logic "1" is stored to a most significant bit of the program counter 1. Logic "0" of a least significant bit of the program counter 1 inputted to the address register 4 as the first scan signal 108 is stored to a most significant bit of the address register 4. Logic "1" of a least significant bit of the address register 4 inputted to the instruction register 5 as the second scan signal 109 is stored to a most significant bit of the instruction register 5. Further, logic "1" of a least significant bit of the instruction register 5 inputted to the check sum register 6 as the third scan signal 110 is stored to a most significant bit of the check sum register 6. Furthermore, logic "1" of a least significant bit of the check sum register 6 is inputted to the 3-state buffer 11 as the fourth scan signal 111. Accordingly, the buffer control signal 123 shows logic "1" and the 3-state buffer 11 outputs logic "1" and the logic "1" is transmitted to the scan-out terminal 122.

Thus, contents of the check sum register 6 can be observed at the scan-out terminal 122 by a shift operation from the T15 cycle to the T22 cycle. Contents of the instruction register 5 can be also observed at the scan-out terminal 122 by a shift operation from the T23 cycle to the T38 cycle. Further, contents of the address register 4 can be observed at the scan-out terminal 122 by a shift operation from the T39 cycle to the T46 cycle. Furthermore, contents of the program counter 1 can be observed at the scan-out terminal 122 by a shift operation from the T47 cycle to the T54 cycle.

A generating position of an error can be accurately observed by such operations. Thus, a time required to analyze the error can be shortened and countermeasures of a defect can be rapidly taken.

Figure 5:
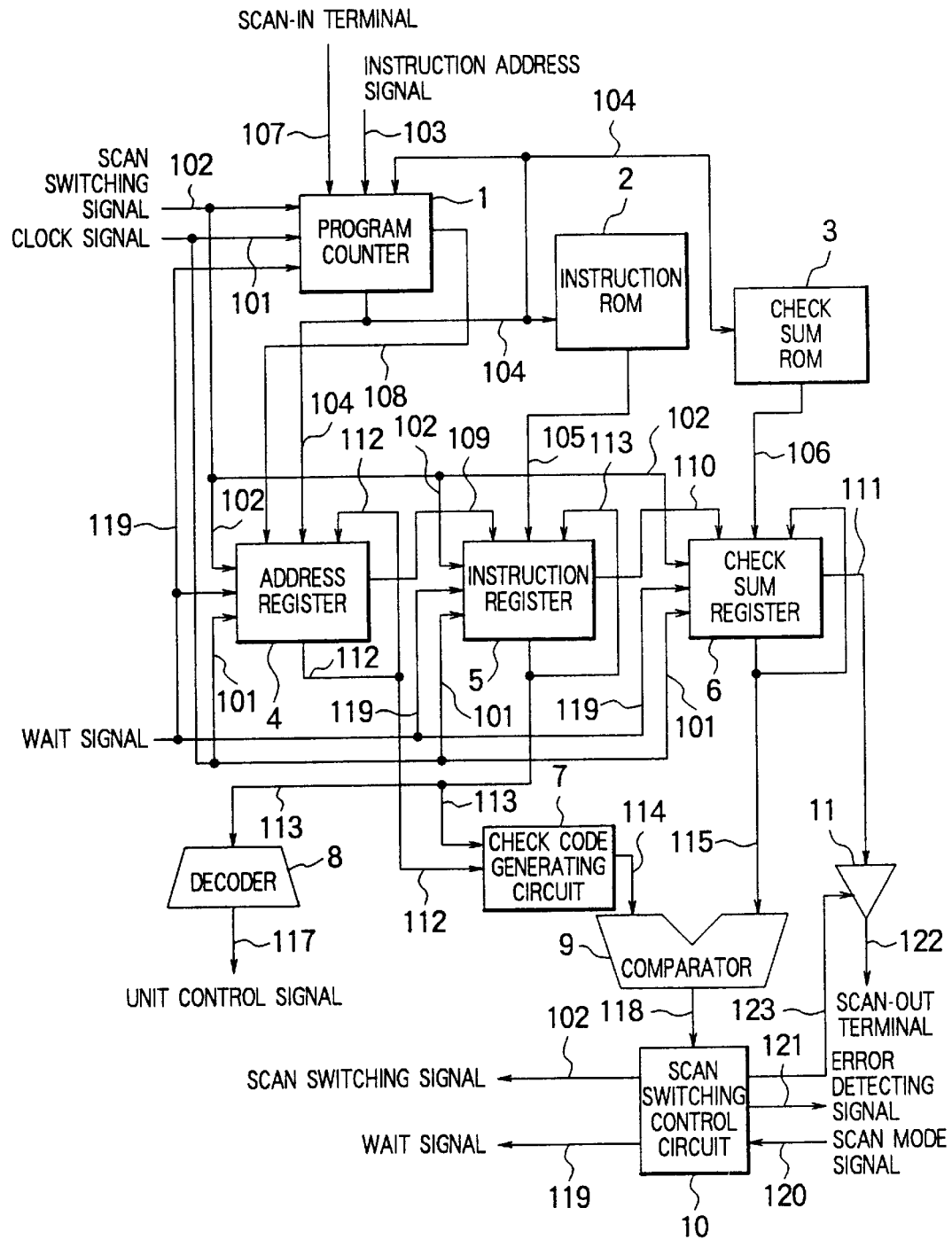
FIG. 5 is a block diagram showing the construction of a semiconductor integrated circuit in accordance with a second embodiment of the present invention.

FIG. 5 is a block diagram showing the construction of a semiconductor integrated circuit in accordance with a second embodiment of the present invention. The second embodiment shown in FIG. 5 differs from the first embodiment shown in FIG. 3 only in that a scan-in terminal is connected to a most significant bit of the program counter 1. Accordingly, in FIG. 5, the same things as those shown in FIG. 3 are designated by the same reference numerals and a detailed explanation thereof is omitted. As shown in FIG. 5, the scan-in terminal (input terminal) is connected to the most significant bit of the program counter 1 in the second embodiment. Accordingly, an expected value signal 107 can be scan-inputted from the scan-in terminal.

Similar to the first embodiment, the program counter (first memory) 1 is a circuit for sequentially outputting an address signal 104 to an instruction ROM 2 and a check sum ROM 3 and storing the address signal 104 in synchronization with a rising edge of a clock signal 101. The program counter 1 is constructed by a register of 8 bits. In this embodiment, the expected value signal 107 as another signal inputted to the program counter 1 can be additionally inputted from the scan-in terminal to the most significant bit of the program counter 1.

Thus, the program counter 1, the address counter 4, the instruction register 5 and the check sum register 6 are serially connected to each other. Accordingly, similar to the first embodiment, contents stored to each memory can be observed at the scan-out terminal 122 by shifting these stored contents.

An expected value check sum of an instruction showing a detected error is simultaneously inputted to the check sum register 6 by shifting the expected value signal 107 inputted to the program counter 1. Also, an instruction for correcting an error portion to the expected value is inputted to the instruction register 5. Further, an address for storing the instruction showing the detected error is inputted to the address register 4. Furthermore, an instruction for reading the next cycle to a cycle having the detected error and an address for designating an expected value check sum of this instruction can be inputted to the program counter 1. By this, it is possible to confirm whether the instruction ROM 2 is normally operated or not.

Figure 6:
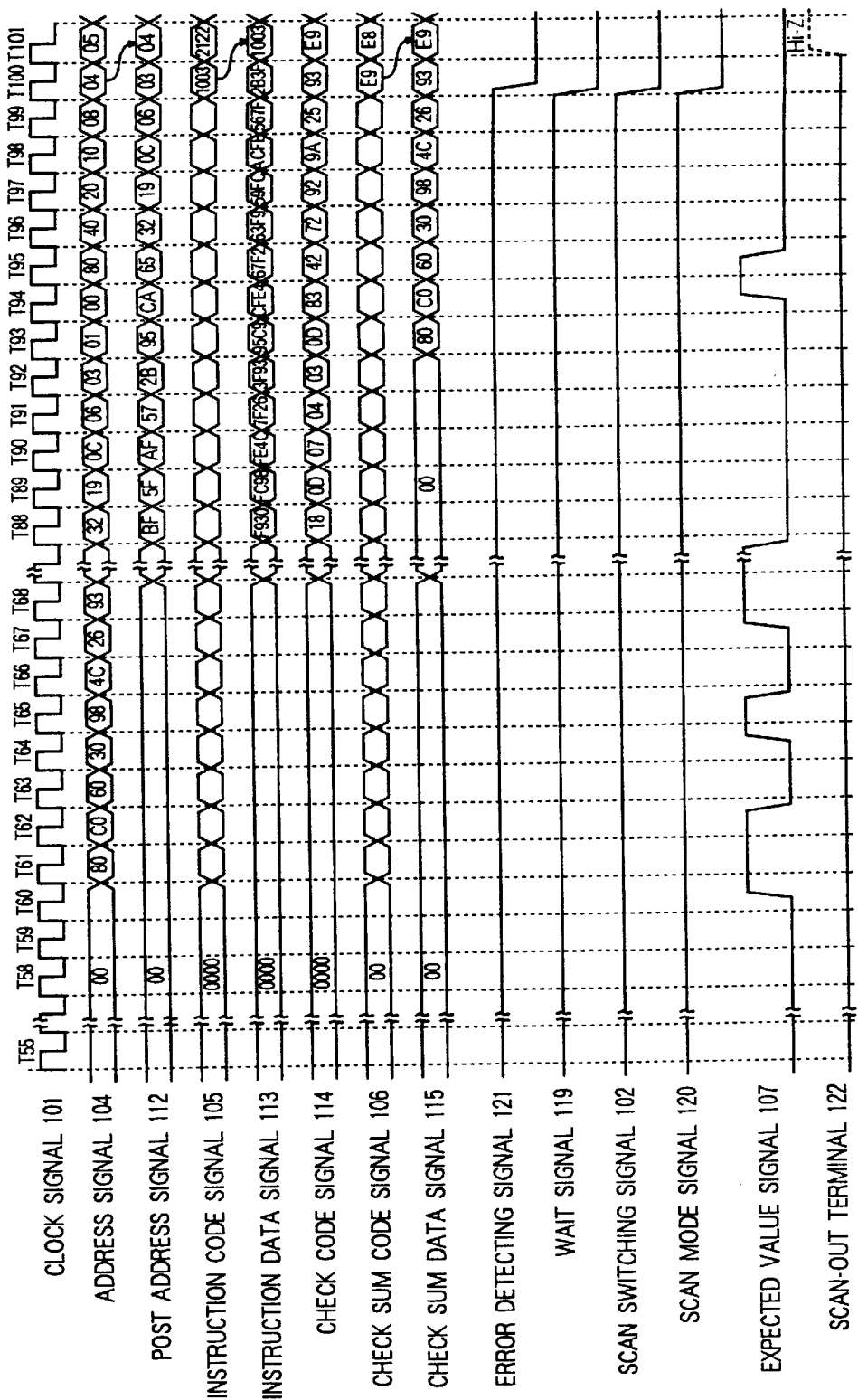
FIG. 6 is a timing chart showing an operating example of the semiconductor integrated circuit in accordance with the second embodiment shown in FIG. 5.

FIG. 6 is a timing chart showing an operating example of the semiconductor integrated circuit in accordance with the second embodiment shown in FIG. 5. In FIG. 6, signals having bit widths are represented by hexadecimal values. Another operating example of the error detecting circuit will be explained with reference to FIGS. 5 and 6.

Similar to the second operation described with reference to FIG. 4, an error is detected in cycles from T55 to T59. At this time, a scan mode signal 120 shows logic "1", and a scan switching signal 102, a wait signal 119 and a buffer control signal 123 show logic "1". In cycles from T55 to T60, an address signal 104, a post address signal 112, a detected object check sum signal 114, a check sum signal 106 and a check sum data signal 115 show a hexadecimal value of [00], and an instruction code signal 105 and an instruction data signal 113 show a hexadecimal value of [0000].

A scan mode operation is next performed as a first operation. First, expected value data are inputted to the check sum register 6 in a sequential order from a least significant bit of the register to a high order bit. Next, the expected value data are similarly sequentially inputted to the instruction register 5, the address register 4 and the program counter 1 from a least significant bit to a high order bit. Finally, the expected value data are inputted to a most significant bit of the program counter 1.

For example, in a T60 cycle, logic "1" as expected value data at bit 0 of the check sum register 6 is set to a scan-in terminal as an expected value signal 107. Thereafter, in a T61 cycle, logic "1" set to the scan-in terminal as the expected value signal 107 in the T60 cycle is stored to the most significant bit of the program counter 1 connected to the scan-in terminal. Then, logic "1" as expected value data at bit 1 of the check sum register 6 is set to the scan-in terminal as the expected value signal 107.

Similarly, an expected value check sum [93] is set to the check sum register 6 by setting and shift input of the expected value signal 107 in cycles from T60 to T67. Next, in cycles from T68 to T83, an expected value instruction [2B3F] for correcting each of error portion bits 4 and 5 to logic "1" is set to the instruction register 5. Next, in cycles from T84 to T91, an address [03] for storing an instruction having a detected error is stored to the address register 4. Thereafter, in cycles from T92 to T99, an instruction for reading the next cycle to a cycle having the detected error and an address [04] for designating an expected value check sum signal of this instruction are set to the program counter 1.

Thereafter, an operation for releasing the scan mode is performed as a second operation in a T100 cycle. Namely, setting of data to the program counter 1, the address register 4, the instruction register 5 and the check sum register 6 is terminated and the scan mode signal 120 is set to show logic "0". Thus, the scan switching signal 102 and the wait signal 119 show logic "0" and the scan mode and a wait state are released. At this time, the instruction address signal 103, the address signal 104, the instruction code signal 105 and the check sum code signal 106 are respectively selected as input signals to the program counter 1, the address register 4, the instruction register 5 and the check sum register 6.

In cycles after the T100 cycle, the expected value data have been inputted to each of the registers in the T100 cycle so that a normal operation is executed.

In the above first and second embodiments, the instruction ROM 2 and the check sum ROM 3 are respectively constructed by 256 words×16 bits and 256 words×8 bits. However, in the present invention, no constructions of the instruction ROM and the check sum ROM are limited to the above embodiments, but each of the instruction ROM and the check sum ROM and so forth can be constructed by an arbitrary number of words and an arbitrary bit width. Further, in the first and second embodiments, the (detected object) check sum signal is used as a check code signal, but effects of the present invention can be also obtained by using a parity signal as the check code signal.

What is claimed is:

1. A semiconductor integrated circuit comprising:
    an instruction memory for receiving an address signal, outputting an instruction code signal corresponding to said address signal, and storing an instruction code in advance:
    a first memory for receiving a clock signal and sequentially outputting and storing said address signal in synchronization with said clock signal;
    a second memory for temporarily storing and outputting said instruction code signal in synchronization with said clock signal; and
    an error detecting circuit detecting an error in operation of said instruction memory by comparing a check code signal generated every cycle of said clock signal with check data corresponding to said instruction code and its address value in accordance with a signal outputted from said second memory and said address signal,
    wherein said error detecting circuit includes
    a third memory for temporarily storing and outputting a post address signal in synchronization with said clock signal;
    a check code generating circuit for generating said check code signal in accordance with signals outputted from said second and third memory;
    a check data memory for storing said instruction code and said check data corresponding to its address value in advance and outputting a check data signal corresponding to said address signal;
    a fourth memory for temporarily storing and outputting said check data signal outputted from said check data memory in synchronization with said clock signal; and
    a comparator for comparing a signal outputted from said fourth memory with said check code signal output from said check code generating circuit and outputting a compared result signal.

2. The semiconductor integrated circuit as claimed in claim 1, wherein said error detecting circuit includes a scan mode switching control circuit for controlling switching to a scan mode operation in accordance with a scan mode signal and said compared result signal; and a buffer for outputting each scan signal in series at a time of said scan mode operation in accordance with a signal outputted from said scan mode switching control circuit; and said first to fourth memory perform said scan mode operation corresponding to said signal outputted from said scan mode switching control circuit, and said scan signal is sequentially inputted to said first to fourth memory and is sequentially outputted from said memory to said buffer.

3. The semiconductor integrated circuit as claimed in claim 2, wherein said scan mode switching control circuit controls said switching to said scan mode when compared results of said comparator are not in conformity with each other.

4. The semiconductor integrated circuit as claimed in claim 2, wherein said buffer includes a scan-out terminal and said scan signal is outputted in series from said buffer through said scan-out terminal.

5. The semiconductor integrated circuit as claimed in claim 1, wherein said first memory includes a scan-in terminal and an expected value signal is inputted to said first memory through said scan-in terminal.

6. The semiconductor integrated circuit as claimed in claim 1, wherein said instruction memory comprises a read only memory.

7. The semiconductor integrated circuit as claimed in claim 1, wherein said check data memory is constructed by a read only memory.

8. The semiconductor integrated circuit as claimed in claim 1, wherein said check code signal comprises a signal of one kind selected from a group of a check sum signal and a parity signal.

9. A semiconductor integrated circuit comprising:

means for storing instruction codes, receiving an address signal, and outputting an instruction code signal corresponding to one of said instruction codes in accordance with said address signal;

a first memory for receiving a clock signal, and storing and outputting said address signal in synchronization with said clock signal;

a second memory for receiving said clock signal, and storing and outputting said instruction code signal in synchronization with said clock signal; and an error detecting circuit including a third memory for receiving said clock signal , and storing and outputting a post address signal in synchronization with said clock signal;

means for generating a check code signal in accordance with said instruction code signal outputted from said second memory and said post address signal outputted from said third memory;

a check data memory for storing an instruction code corresponding to said instruction code signal and an expected value check sum corresponding to an address value of said instruction code, and for receiving said address signal and producing a check sum code signal in accordance with said address signal;

a fourth memory for receiving said clock signal , and storing and outputting said check sum code signal outputted from said check data memory in synchronization with said clock signal; and a comparator for comparing the check sum code signal outputted from said fourth memory with said check code signal and outputting a compared result signal.

* * * * *